US008633465B2

(12) United States Patent  (10) Patent No.: US 8,633,465 B2
Huang et al.  (45) Date of Patent: Jan. 21, 2014

(54) MULTILEVEL RESISTIVE MEMORY HAVING LARGE STORAGE CAPACITY

(75) Inventors: Ru Huang, Beijing (CN); Gengyu Yang, Beijing (CN); Yimao Cai, Beijing (CN); Yu Tang, Beijing (CN); Lijie Zhang, Beijing (CN); Yue Pan, Beijing (CN); Shenghu Tan, Beijing (CN); Yinglong Huang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/513,155

(22) PCT Filed: Feb. 8, 2012

(86) PCT No.: PCT/CN2012/070952
§ 371 (c)(1),
(2), (4) Date: May 31, 2012

(87) PCT Pub. No.: WO2013/037195
PCT Pub. Date: Mar. 21, 2013

(65) Prior Publication Data
US 2013/0069031 A1    Mar. 21, 2013

(30) Foreign Application Priority Data

Sep. 16, 2011    (CN) .......................... 2011 1 0274869

(51) Int. Cl.
*H01L 47/00*    (2006.01)

(52) U.S. Cl.
USPC ................ 257/4; 257/2; 257/3; 257/E47.001; 365/148; 365/185.13; 365/185.06; 365/185.05

(58) Field of Classification Search
USPC ........... 257/E47.001, E45.003, 1–4, E21.004; 438/382, 385; 365/148, 185.13, 365/185.11, 185.06, 185.05, 185.23
See application file for complete search history.

(56) References Cited

U.S. PATENT DOCUMENTS

| 2003/0156452 | A1 | 8/2003 | Gilton |
| 2009/0302302 | A1* | 12/2009 | Heo et al. .......................... 257/4 |
| 2010/0027320 | A1 | 2/2010 | Muraoka et al. |
| 2012/0113706 | A1* | 5/2012 | Williams et al. .............. 365/148 |

FOREIGN PATENT DOCUMENTS

| CN | 1647209 A | 7/2005 |
| CN | 101281953 A | 10/2008 |
| CN | 101577308 A | 11/2009 |
| CN | 101630719 | 1/2010 |

(Continued)

OTHER PUBLICATIONS

International Search Report and Written Opinion issued in PCT/CN2012/070952, dated Jul. 5, 2012.

(Continued)

*Primary Examiner* — Mark A Laurenzi
(74) *Attorney, Agent, or Firm* — DLA Piper LLP US

(57) ABSTRACT

The present invention discloses a multilevel resistive memory having large storage capacity, which belongs to a field of a fabrication technology of a resistive memory. The resistive memory includes an top electrode and a bottom electrode, and a combination of a plurality of switching layers and defective layers interposed between the top electrode and the bottom electrode, wherein, the top electrode and the bottom electrode are respectively contacted with a switching layer (a film such as $Ta_2O_5$, $TiO_2$, $HfO_2$), and the defective layers (metal film such as Ti, Au, Ag) are interposed between the switching layers. By using the present invention, a storage capacity of a resistive memory can be increased.

20 Claims, 3 Drawing Sheets

(56) References Cited

FOREIGN PATENT DOCUMENTS

| CN | 101826598 | 9/2010 |
|---|---|---|
| CN | 102097586 | 6/2011 |
| CN | 102306705 | 1/2012 |
| WO | WO 2008/081742 A1 | 7/2008 |

OTHER PUBLICATIONS

English Language Abstract of CN 101630719 published Jan. 20, 2010.
English Language Abstract of CN 102097586 published Jun. 15, 2011.
English Language Abstract of CN 101826598 published Sep. 8, 2010.
English Language Abstract of CN 102306705 published Jan. 4, 2012.
First Office Action of counterpart Chinese patent application No. CN201110274869.1, issued by SIPO on Dec. 13, 2012.
English Language Abstract of CN 101577308A published Nov. 11, 2009.
English Language Abstract of CN 101281953A published Oct. 8, 2008.

* cited by examiner

MULTILEVEL RESISTIVE MEMORY HAVING LARGE STORAGE CAPACITY

CROSS-REFERENCES TO RELATED APPLICATION

The present application claims priority to Chinese application number NO. 201110274869.1, filed on Sep. 16, 2011, which is incorporated herein by reference.

FIELD OF THE INVENTION

Embodiments of the present invention relate to a method capable of increasing storage capacity of a resistive memory, and particularly relate to a resistive memory having large storage capacity.

BACKGROUND OF THE INVENTION

As an important achievement during development of semiconductor industry, memories play an irreplaceable role in our today's society which takes information technology as a foundation. In mobile phones, personal computers, music players, and various handheld devices and vehicle-mounted devices, memories are used in almost every aspect. With development of the semiconductor industry, there are more and more demands on capacity of the memories. From a conventional magnetic resistance hard disk driver to a flash memory, current products are difficult to satisfy the demands on the capacity of memories, thereby to promote an emerge of some new memories, in which a resistive memory (RRAM or ReRAM) is a typical representative.

The resistive memory has a typical structure of MIM (Metal-insulator-Metal), and can achieve a free transition between a high resistance and a low resistance under the control of an external voltage. Howerver, a typical single resistive memory can only perform a two-level storage, greatly limiting a further increased storage capacity of the resistive memory, and thus it becomes a nonnegligible demand that a storage capacity of a single resistive memory is required to be increased, that is, a multilevel storage is required.

SUMMARY OF THE INVENTION

An object of an embodiment of the present invention is to provide a structure capable of increasing a storage capacity of a resistive memory as follow.

A multilevel resistive memory having a large storage capacity comprises a top electrode and a bottom electrode, and a combination of a plurality of defective layers and switching layers interposed therebetween. As shown in FIG. 1, the top electrode and the bottom electrode are metal films (for example, W, Al, Pt, TIN, etc.), the top electrode and the bottom electrode are respectively contacted with a switching material layer (a film such as $Ta_2O_5$, $TiO_2$, $HfO_2$, etc.), and the defective layers (metal film such as Ti, Au, Ag, etc.) are interposed between the switching material layers.

An embodiment of the present invention further provides a method for fabricating the above multilevel resistive memory. By taking a memory cell having two switching material layers and one defective layer between the top electrode and the bottom electrode as an example, the processing method comprises the following steps:

1) depositing a metal layer with a thickness between 150 nm and 500 nm over a substrate (generally may be a silicon substrate, and also may be a glass substrate, etc.), and performing a photolithographic process on the metal layer to form a bottom electrode pattern;

2) depositing a switching material film with a thickness between 10 nm and 80 nm;

3) depositing a defective layer with a thickness between 2 nm and 50 nm;

4) depositing a switching material film with a thickness between 10 nm and 80 nm again;

5) depositing a defective layer with a thickness between 2 nm and 50 nm again;

6) depositing a switching material film with a thickness between 10nm and 80nm; and 7) depositing a metal layer for the top electrode with a thickness between 150 nm and 500 nm, and performing a photolithography on the metal layer to form a top electrode pattern.

An operating principle of a memory according to an embodiment of the present invention is described as follow.

In initial state, the entire memory cell is not turned-on, that is, in the high resistance state, and the resistance is noted as R0. When a suitable bias voltage is applied to the top electrode, oxygen vacancies are generated in the switching material layer, and accumulate from the top electrode toward the bottom electrode, and thus to form an increasingly grown conductive filament. When the conductive filament contacts with the first layer of defective layers, the switching material layer between the top electrode and the first layer of defective layers becomes into the low resistance state, and the entire memory cell has a correspondingly decreased resistance which is noted as R1. When the bias voltage is continually applied, the conductive filament continues to grow, and as the conductive filament contacts with the second layer of defective layers, the switching material layer between the top electrode and the second layer of defective layers becomes into the low resistance state, and the entire memory cell has a further decreased resistance which is noted as R2. Similarly, when the bias voltage is continually applied, the conductive filament grows to the bottom electrode, and the switching material layers in the entire structure are all turned-on, having a minimum resistance noted as R3 at this time. As such, the memory cell may store four levels (R0, R1, R2, and R3).

If more defective layers are interposed between the intermediate switching layers, the operating principle of the memory is the same as above. As for a resistive memory cell with multilevel storage characteristic, if a structure of an embodiment of the present invention is used, the data which can be stored could be increased.

Figure 1:
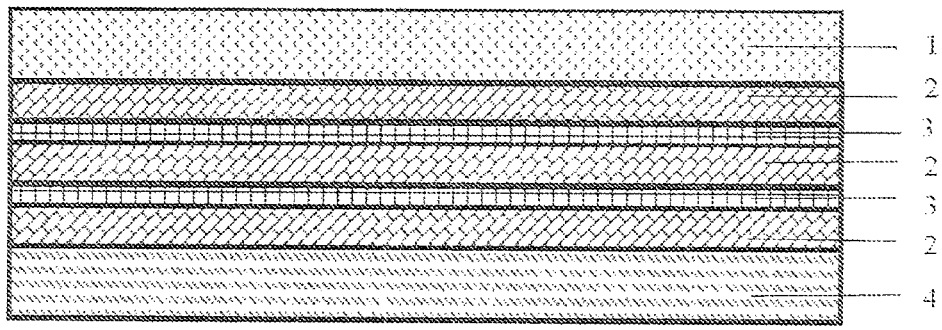
FIG. 1 is a schematic structural diagram of a resistive memory according to an embodiment of the present invention.

In the drawings, 1—an top electrode, 2—a switching material layer, 3—a defective layer, 4—a bottom electrode, and 5—a substrate.

DETAILED DESCRIPTION OF THE EMBODIMENTS

The present invention will now be further described in detail by a specific embodiment in conjunction with drawings.

A method for fabricating a resistive memory according to an embodiment of the present invention is described as follow.

Figure 2A:
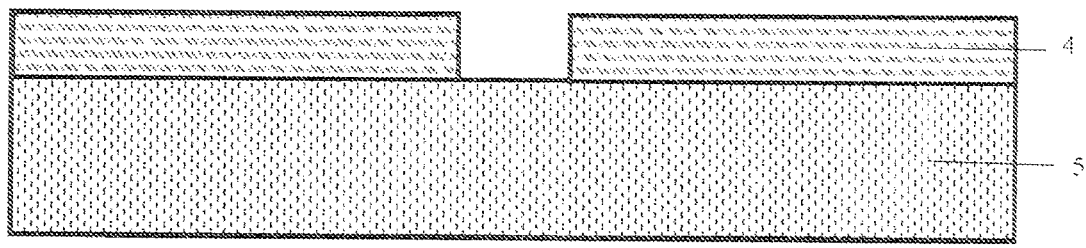
FIG. 2 are diagrams showing a process flow of an embodiment of the present invention.

1) A silicon substrate is usually selected as a substrate. W is used as a bottom electrode, and the bottom electrode with a thickness of 200 nm is formed by using a physical vapor deposition (PVD) method or other film forming methods used in IC process. The bottom electrode is patterned by a photolithographic process, as shown in FIG. 2(a).

Figure 2B:
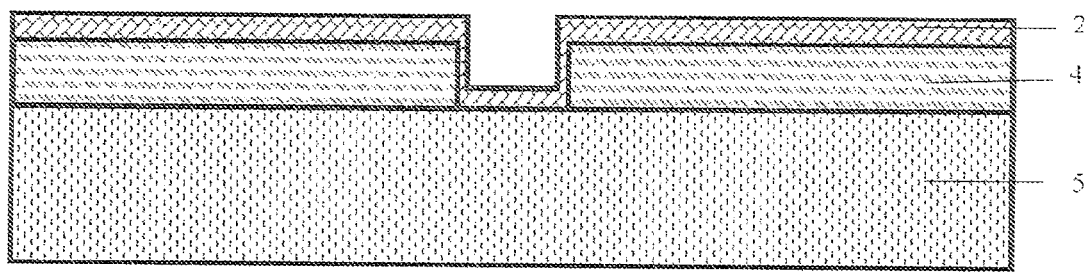

2) $Ta_2O_5$ with a thickness of 10 nm is sputtered, as shown in FIG. 2(b).

Figure 2C:
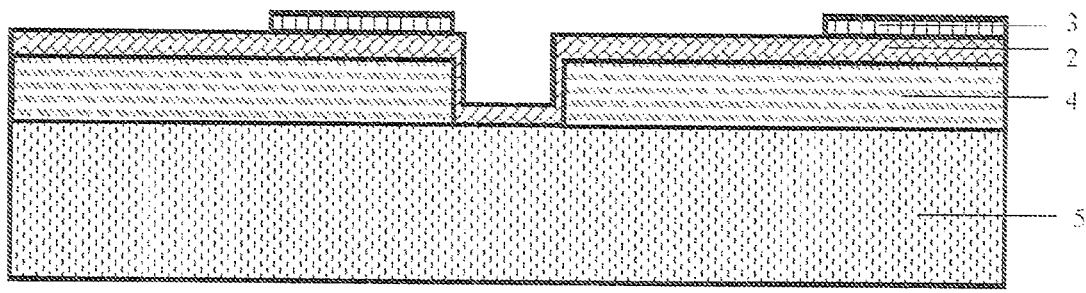

3) A photolithographic process is performed, and a Ti film with a thickness of 10 nm is formed by using a physical vapor deposition (PVD) method or other film forming methods used in the IC process. The Ti film is lifted off to remain a Ti defective layer in a memory cell region, as shown in FIG. 2(c).

Figure 2D:
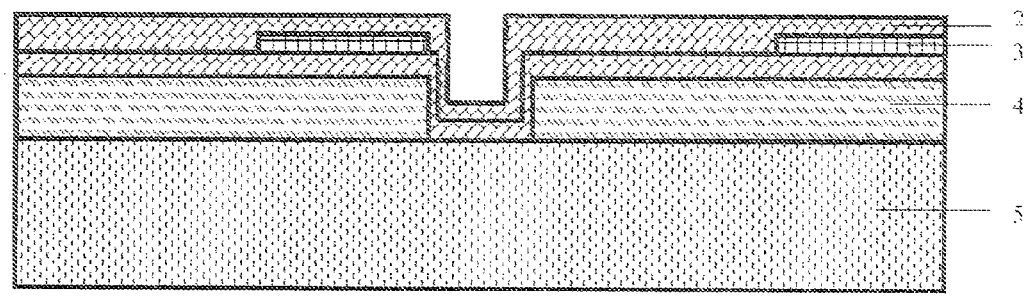

4) $Ta_2O_5$ with a thickness of 10 nm is sputtered, as shown in FIG. 2(d).

Figure 2E:
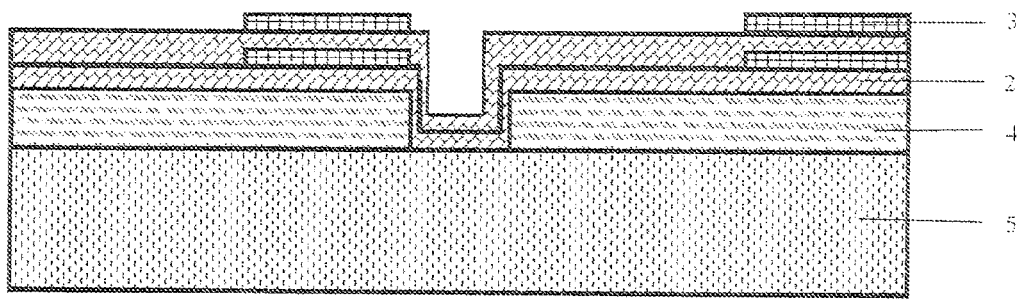

5) A photolithographic process is performed, and a Ti film with a thickness of 10 nm is formed by using a physical vapor deposition (PVD) method or other film forming methods used in the IC process. The Ti film is lifted off to remain a Ti defective layer in a memory cell region, as shown in FIG. 2(e).

Figure 2F:
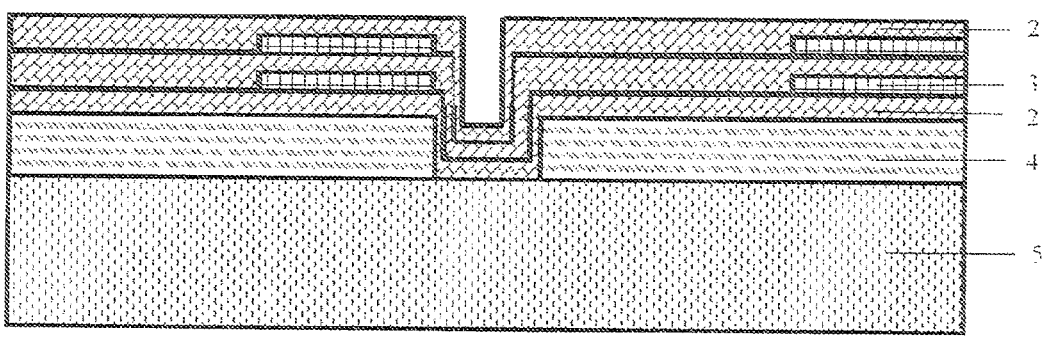

6) $Ta_2O_5$ with a thickness of 10 nm is sputtered, as shown in FIG. 2(f).

Figure 2G:
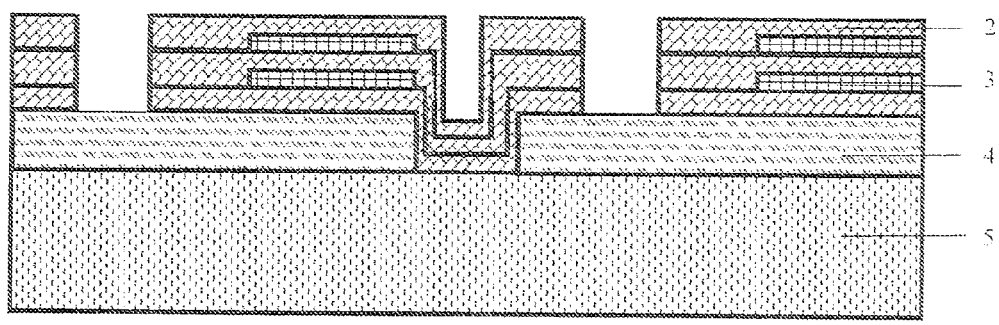

7) A via for the bottom electrode is defined by a photolithographic process and RIE (reactive ion etch) etching process, as shown in FIG. 2(g).

Figure 2H:
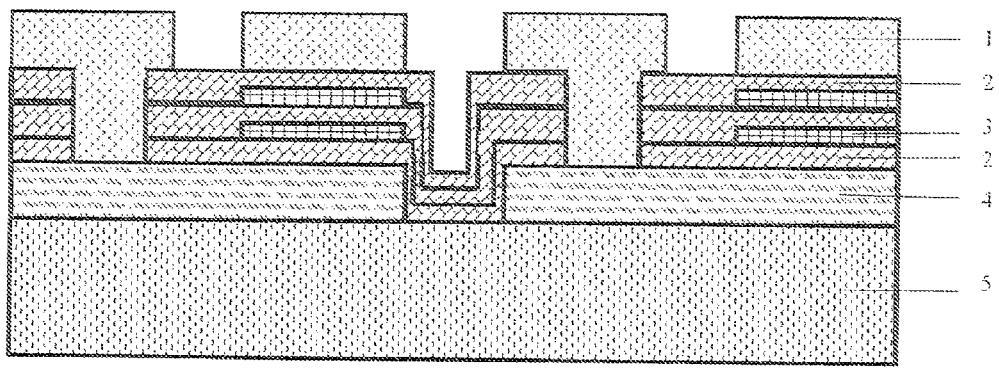

8) A photolithographic process is performed to fabricate an top electrode. A TiN film with a thickness between 150 nm and 500 nm is formed by using a physical vapor deposition (PVD) method or other film forming methods used in the IC process. The top electrode pattern is defined by a lift-off process and the bottom electrode contact is defined, as shown in FIG. 2(h).

Finally, it is to be noted that, the above embodiments are only used for illustrating technical solutions of the present invention, and do not limit the present invention. While the present invention has been described with respect to preferable embodiments, it will be understood by one skilled in the art that various modifications and substitutions can be made without departing from the spirit or scope of the technical solutions of the present invention.

What is claimed is:

1. A multilevel resistive memory comprising:
a top electrode;
a bottom electrode beneath the top electrode; and
a combination of a plurality of switching layers and defective layers interposed between the top electrode and the bottom electrode;
wherein the top electrode and the bottom electrode are respectively contacted with a switching layer, and the defective layers are interposed between the switching layers; and
wherein the defective layers are Ti, Au or Ag metal films.

2. The multilevel resistive memory according to claim 1, wherein the top electrode and the bottom electrode are W, Al, Pt or TiN metal films with a thickness between 150 nm and 500 nm.

3. The multilevel resistive memory according to claim 1, wherein the switching layers are $Ta_2O_5$, $TiO_2$ or $HfO_2$ films with a thickness between 10 nm and 80 nm.

4. The multilevel resistive memory according to claim 1, wherein the defective layers have a thickness between 2 nm and 50 nm.

5. The multilevel resistive memory according to claim 2, wherein the switching layers are $Ta_2O_5$, $TiO_2$ or $HfO_2$ films with a thickness between 10 nm and 80 nm.

6. The multilevel resistive memory according to claim 2, wherein the defective layers have a thickness between 2 nm and 50 nm.

7. The multilevel resistive memory according to claim 1, wherein the memory is provided in an order of the bottom electrode, a first switching layer, a first defective layer, a second switching layer, a second defective layer, a third switching layer and the top electrode.

8. The multilevel resistive memory according to claim 7, wherein each of the first defective layer and the second defective layer is about 10 nm thick.

9. The multilevel resistive memory according to claim 7, wherein each of the first switching layer, the second switching layer and the third switching layer is about 10 nm thick.

10. The multilevel resistive memory according to claim 7, wherein the memory stores 4 levels.

11. The multilevel resistive memory according to claim 10, wherein the levels are resistance states.

12. The multilevel resistive memory according to claim 1, wherein the bottom electrode is about 200 nm thick.

13. The multilevel resistive memory according to claim 1, wherein the switching layer is about 10 nm thick.

14. The multilevel resistive memory according to claim 1, wherein the defective layer(s) is/are about 10 nm thick.

15. The multilevel resistive memory according to claim 1, wherein the defective layer(s) is/are formed of Ti about 10 nm thick.

16. The multilevel resistive memory according to claim 1, wherein the top bottom electrode includes a via.

17. The multilevel resistive memory according to claim 1, wherein the memory is formed by processing including physical vapor deposition.

18. The multilevel resistive memory according to claim 3, wherein the switching layer(s) is/are $Ta_2O_5$ about 10 nm thick.

19. A multilevel resistive memory, comprising:
a top electrode comprised of a W, Al, Pt or TiN metal film;
a bottom electrode beneath the top electrode, the bottom electrode comprised of a W, Al, Pt or TiN metal film; and
a combination of a plurality of switching layers and defective layers interposed between the top electrode and the bottom electrode, the switching layers comprised of $Ta_2O_5$, $TiO_2$ or $HfO_2$ films having a thickness between 10 nm and 80 nm, and the defective layers comprised of Ti, Au or Ag metal films having a thickness between 2 nm and 50 nm;
wherein the top electrode and the bottom electrode are respectively contacted with a switching layer, and the defective layers are interposed between the switching layers; and
wherein the top electrode and the bottom electrode each have a thickness between 150 nm and 500 nm.

20. A multilevel resistive memory, comprising:
a top electrode comprised of a W, Al, Pt or TiN metal film;
a bottom electrode beneath the top electrode, the bottom electrode comprised of a W, Al, Pt or TiN metal film; and
a combination of a plurality of switching layers and defective layers interposed between the top electrode and the bottom electrode, the switching layers comprised of $Ta_2O_5$, $TiO_2$ or $HfO_2$ films having a thickness between about 10 nm and about 80 nm, and the defective layers comprised of Ti, Au or Ag metal films having a thickness between about 2 nm and about 50 nm;

wherein the top electrode and the bottom electrode are respectively contacted with a switching layer, and the defective layers are interposed between the switching layers;

wherein the top electrode and the bottom electrode each have a thickness between about 150 nm and about 500 nm;

wherein the memory is provided in an order of the bottom electrode, a first switching layer, a first defective layer, a second switching layer, a second defective layer, a third switching layer and the top electrode;

wherein the memory stores four levels of resistance states;

wherein at least one of the first defective layer and the second defective layer is about 10 nm thick; and wherein at least one of the first switching layer, and the second switching layer and the third switching layer is about 10 nm thick.

* * * * *